United States Patent
Hanks et al.

(10) Patent No.: US 9,805,919 B1
(45) Date of Patent: Oct. 31, 2017

(54) RF DETECTOR WITH DOUBLE BALANCED LINEAR MIXER AND CORRESPONDING METHOD OF OPERATION

(71) Applicant: Lam Research Corporation, Fremont, CA (US)

(72) Inventors: Ernest Beauel Hanks, Santa Clara, CA (US); John Pease, San Mateo, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/405,913

(22) Filed: Jan. 13, 2017

(51) Int. Cl.
  *H04B 17/00* (2015.01)
  *H01J 37/32* (2006.01)
  *H01L 21/67* (2006.01)

(52) U.S. Cl.
  CPC ...... *H01J 37/32935* (2013.01); *H01J 37/321* (2013.01); *H01J 37/32091* (2013.01); *H01J 37/3299* (2013.01); *H01J 37/32155* (2013.01); *H01J 37/32183* (2013.01); *H01L 21/67034* (2013.01); *H01L 21/67069* (2013.01); *H01L 21/67253* (2013.01); *H01J 2237/334* (2013.01); *H01J 2237/335* (2013.01); *H01J 2237/3321* (2013.01); *H01J 2237/3365* (2013.01)

(58) Field of Classification Search
  CPC .......................... H01J 37/32091; H01J 37/321
  See application file for complete search history.

(56) References Cited

U.S. PATENT DOCUMENTS

| | | | |
|---|---|---|---|
| 7,209,725 B1* | 4/2007 | Sorrells | H03D 3/001 370/420 |
| 2016/0094331 A1* | 3/2016 | White | H04B 1/525 370/278 |

\* cited by examiner

*Primary Examiner* — Nguyen Vo

(57) ABSTRACT

A RF detector is provided and includes LO and RF paths, a mixer and a filter. The LO path includes a first buffer and a sine-to-square wave converter. The first buffer receives a first RF signal that is based on a RF input signal received by the RF detector. The RF input signal is detected within a substrate processing system. The sine-to-square wave converter converts a sine wave of the first RF signal to a square wave and outputs a LO signal having the square wave. The RF path includes a second buffer that receives a second RF signal and outputs a RF output signal. The second RF signal is based on the RF input signal. The mixer generates an IF signal based on the LO and RF output signals. The filter filters the IF signal to generate a DC signal, which is representative of the second RF signal.

29 Claims, 11 Drawing Sheets

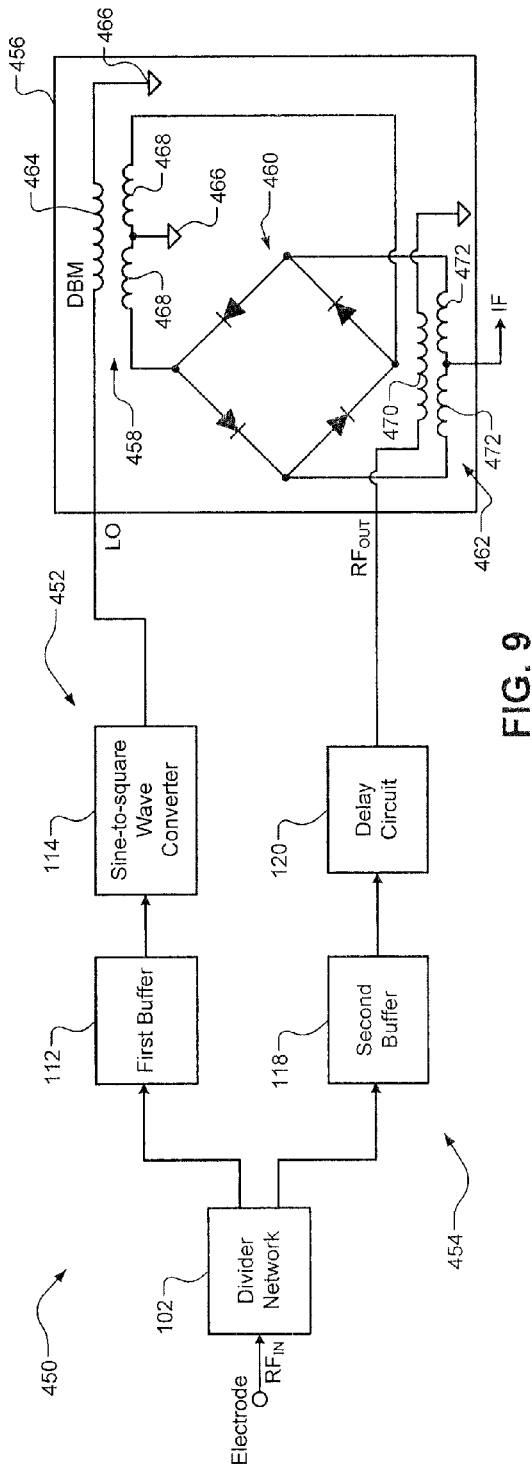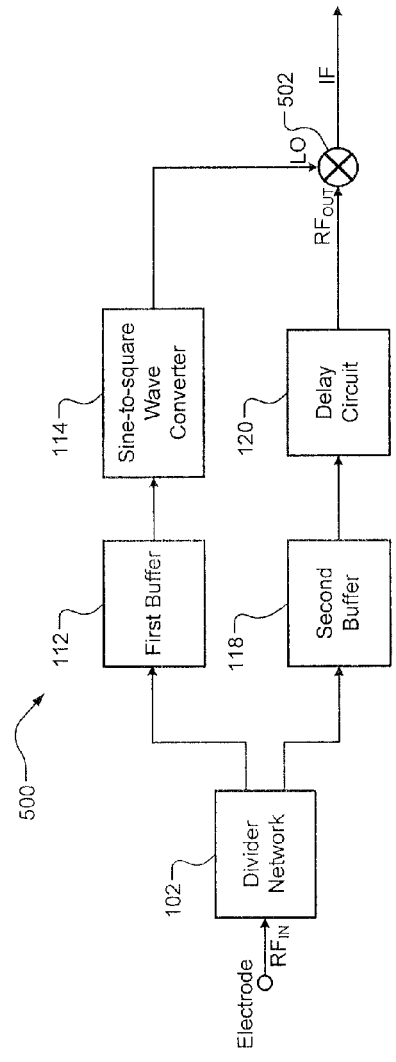
FIG. 9
FIG. 10

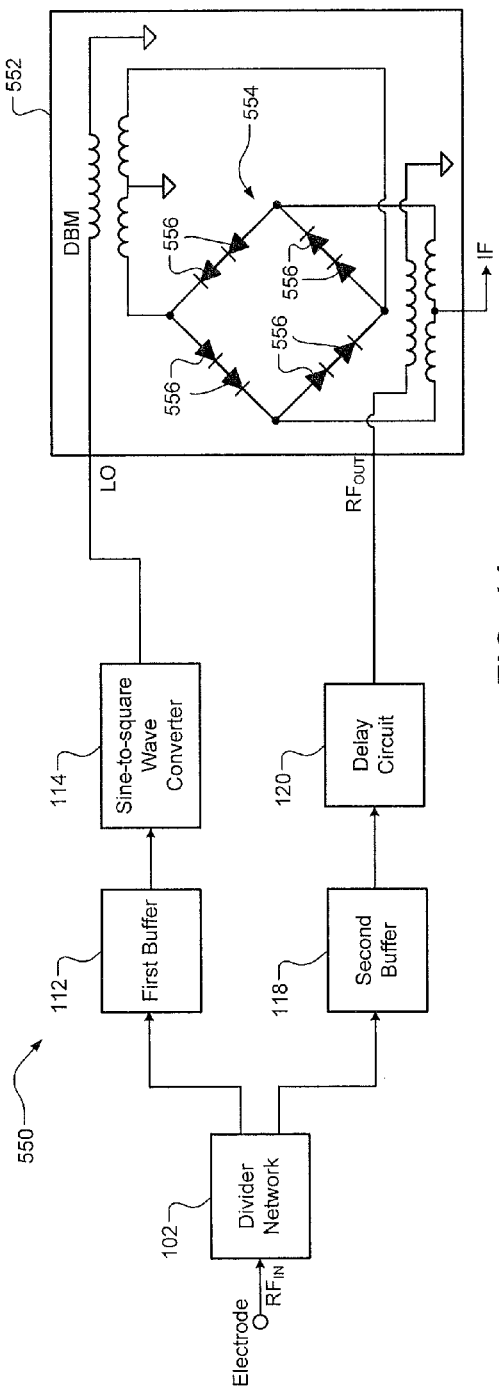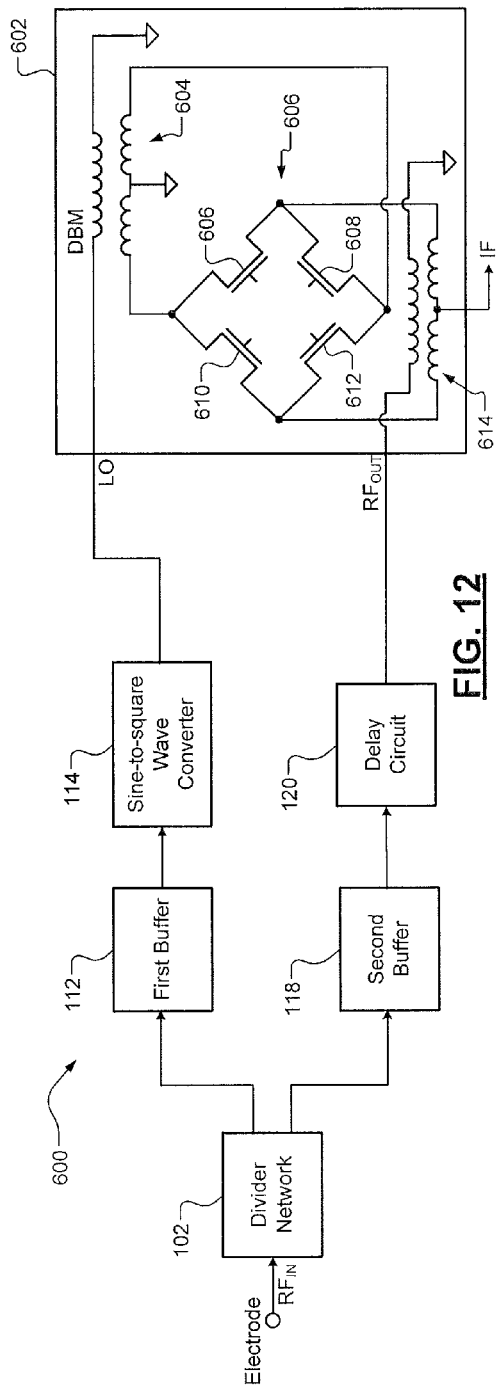

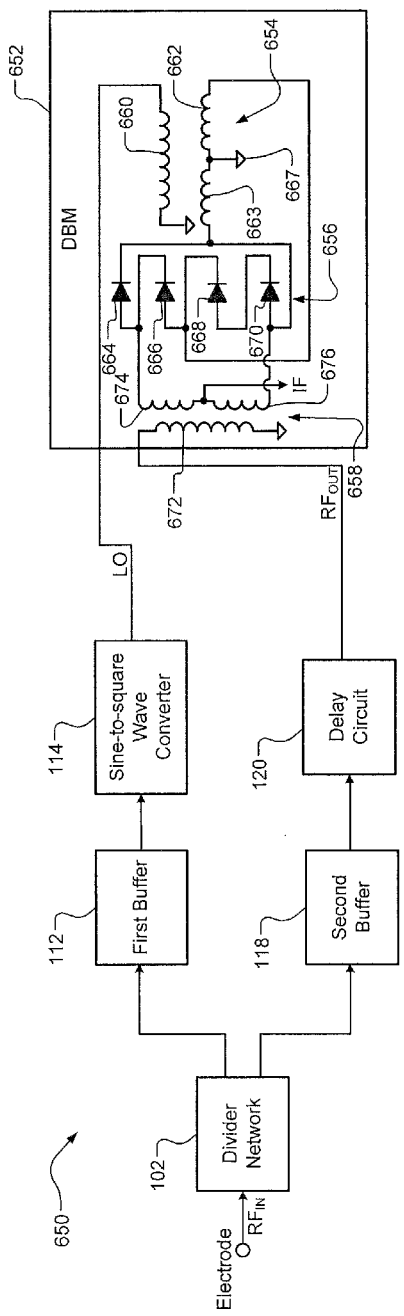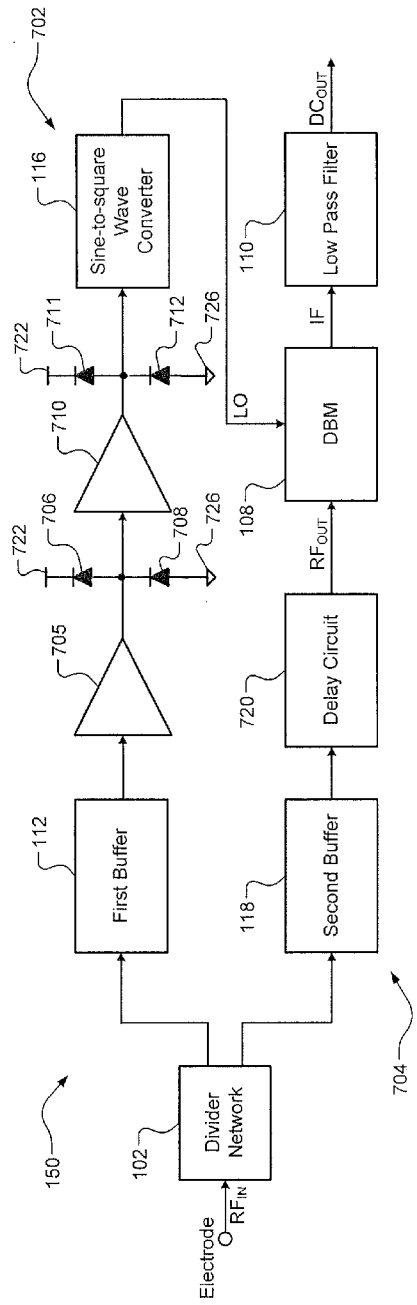

RF DETECTOR WITH DOUBLE BALANCED LINEAR MIXER AND CORRESPONDING METHOD OF OPERATION

FIELD

The present disclosure relates to radio frequency detectors.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Ionized gas, or plasma, is commonly used during the processing and fabrication of semiconductor devices. For example, plasma can be used to etch or remove material from a substrate such as a semiconductor wafer, and to sputter or deposit material onto the substrate. Creating plasma for use in manufacturing or fabrication processes typically begins by introducing process gases into a processing chamber. The substrate is disposed in the processing chamber on a substrate support such as an electrostatic chuck or a pedestal.

The processing chamber may include a transformer coupled plasma (TCP) coil. A radio frequency (RF) signal, supplied by a power supply, is supplied to the TCP coil. A dielectric window, constructed of a material such as ceramic, is incorporated into an upper surface of the processing chamber. The dielectric window allows the RF signal from the TCP coil to be transmitted into the interior of the processing chamber. The RF signal excites gas molecules within the processing chamber to generate plasma.

A bias RF power source supplies a biasing RF signal to the substrate support. The biasing RF signal can be used to increase the direct current (DC) bias and/or a DC sheath potential to increase the energy with which the charged particles strike the substrate. Variations in the biasing RF signal produce corresponding variations in the DC bias and/or DC sheath potential at the substrate affecting the process characteristics.

A pickup device may be attached to the substrate support and is used to detect an RF input signal at the substrate support. A RF detector is connected to the pickup device and detects the RF input signal. The biasing RF signal may be adjusted based on the detected RF input signal, for example, to minimize variations in the DC bias and/or the DC sheath potential at the substrate.

SUMMARY

A radio frequency detector including a local oscillator path, a radio frequency path, a mixer and a filter. The local oscillator path includes a first buffer and a sine-to-square wave converter. The first buffer is to receive a first radio frequency signal, where the first radio frequency signal is based on a radio frequency input signal received by the radio frequency detector, and where the radio frequency input signal is detected by the radio frequency detector within a substrate processing system. The sine-to-square wave converter is to convert a sine wave of the first radio frequency signal to a square wave and output a local oscillator signal having the square wave. The radio frequency path includes a second buffer, where the second buffer is to receive a second radio frequency signal and output a radio frequency output signal, and where the second radio frequency signal is based on the radio frequency input signal. The mixer is to generate an intermediate frequency signal based on the local oscillator signal and the radio frequency output signal. The filter is to filter the intermediate frequency signal to generate a direct current signal, wherein the direct current signal is representative of the second radio frequency signal.

In other features, a method of operating a radio frequency detector is provided. The radio frequency detector includes a local oscillator path, a radio frequency path, a mixer, and a filter, where the local oscillator path comprises a first buffer and sine-to-square wave converter, and where the radio frequency path comprises a second buffer. The method includes: detecting a radio frequency input signal within a substrate processing system; receiving a first radio frequency signal at the first buffer, wherein the first radio frequency signal is based on the radio frequency input signal; and converting a sine wave of the first radio frequency signal to a square wave via the sine-to-square wave converter and outputting a local oscillator signal having the square wave. The method further includes: receiving a second radio frequency signal at the second buffer and outputting a radio frequency output signal, wherein the second radio frequency signal is based on the radio frequency input signal; generating an intermediate frequency signal via the mixer based on the local oscillator signal and the radio frequency output signal; and filtering the intermediate frequency signal via the filter to generate a direct current signal, where the direct current signal is representative of the second radio frequency signal.

In other features, a radio frequency detector is provided and includes a buffer, a first filter, an amplifier, a local oscillator, a radio frequency path, a double balanced mixer and a second filter. The buffer is to receive a first radio frequency signal, wherein the first radio frequency signal is generated based on a radio frequency input signal received by the radio frequency detector. The radio frequency input signal is detected by the radio frequency detector within a substrate processing system. The first filter is to filter an output of the buffer. The amplifier is to, based on an output of the filter, generate a differential output including a second radio frequency signal and a third radio frequency signal. The local oscillator path includes a sine-to-square wave converter that is to convert a sine wave of the second radio frequency signal to a square wave and output a local oscillator signal having the square wave. The radio frequency path includes a delay circuit, where the delay circuit is to receive the third radio frequency signal and output a radio frequency output signal. The double balanced mixer or a linear mixer is to generate an intermediate frequency signal based on the local oscillator signal and the radio frequency output signal. The second filter is to filter the intermediate frequency signal to generate a direct current signal, wherein the direct current signal is representative of the second radio frequency signal.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 9 is a functional block diagram of an example of another RF RMS detection circuit illustrating a DBM in accordance with the present disclosure;

FIG. 10 is a functional block diagram of an example of another RF RMS detection circuit illustrating a linear multiplier for providing an intermediate frequency (IF) signal based on received LO and RF output signals in accordance with the present disclosure;

FIG. 11 is a functional block diagram of an example of another RF RMS detection circuit including another DBM with a double diode per leg bridge ring in accordance with the present disclosure;

FIG. 12 is a functional block diagram of an example of another RF RMS detection circuit including another DBM with field effect transistors (FETs) in accordance with the present disclosure;

FIG. 13 is a functional block diagram of an example of another RF RMS detection circuit including another DBM with a diode array in accordance with the present disclosure;

FIG. 14 is a functional block diagram of an example of another RF RMS detection circuit including amplifiers and clamp diodes upstream from a sine-to-square wave converter in accordance with the present disclosure;

In the drawings, reference numbers may be reused to identify similar and/or identical elements.

DETAILED DESCRIPTION

Figure 1:
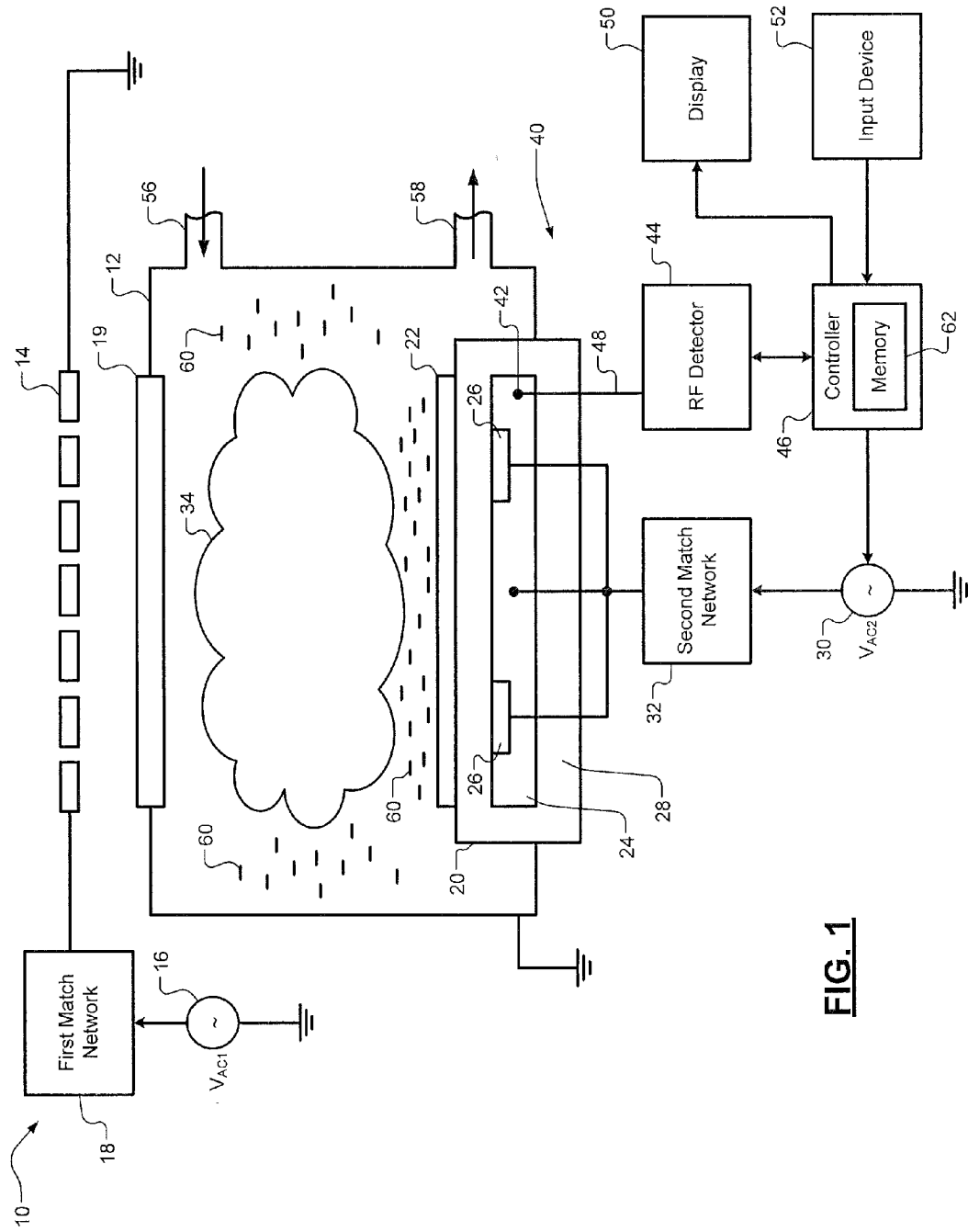
FIG. 1 is a functional block diagram of an example of a plasma processing system incorporating a radio frequency (RF) root mean square (RMS) detection circuit including local oscillator (LO) and RF paths and a double balanced mixer (DBM) in accordance with the present disclosure.

High-voltage and high-current RF measurements may be taken at various points in a processing chamber. As an example, the RE measurements may be taken via RF electrodes in a substrate support. The RF measurements may be used for diagnostic purposes and/or for close-loop feedback control. Examples of RF detectors that may be used to take the RF measurements are a voltage-current (VI) probe and a voltage control interface (VCI) probe. The RF detectors may be used on tools, within RF match circuits and RF generators, and as part of processing system circuits.

RF detectors are used in telecom, defense, and other electronic industry applications. The RE detectors are typically configured for certain dynamic ranges, accuracy levels, transient responses, etc. RF detectors that are designed to have a high dynamic range often exhibit significant errors. Logarithmic (nonlinear) RF detectors, for example, may have a dynamic range of 10,000:1 (80 dB), meaning the received RF voltage may vary, for example, between 10,000 volts and 1 volt. However, the logarithmic RF detectors may only be accurate to approximately 5-10% over the dynamic range. In certain high-voltage and high-current applications, accuracy of better than or equal to ±1% (or linear error of ±1%) is required. This improved accuracy is needed while maintaining a high dynamic range. These accuracy and range requirements are applicable in plasma etching environments.

Requirements of RF detectors can be split into primary requirements and secondary requirements. The primary requirements are main performance requirements that are determined by design and architecture and are typically the first (or primary) performance indicators of interest. The secondary requirements refer to other relevant requirements that are of less interest, but may be satisfied based on the design of the corresponding RF detector.

Examples of primary requirements include dynamic range, accuracy and linearity. Dynamic range refers to a measurement range of a RF detector (e.g. a 1-10V RF detector, a 1-10,000V RF detector, etc.). A dynamic range may be expressed in a simplified form based on a greatest common factor. For example, a 10:1 (or 20 db) dynamic range is equivalent to dynamic ranges of 1-10V, 2-20V, 10-100V, etc. The dynamic range having the simplified ratio is often referred to as a spurious-free radio frequency dynamic range (SFDR). The dynamic range of a RF detector includes a high-end and a low-end. A well designed RF detector has a low-end that is limited by circuit functionality and system and/or component noise limits. The high-end of a RF detector may be limited by linearity errors, which can introduce spurs or nonlinearity when the linearity error is above a predetermined threshold. Traditional 1% high voltage RF detectors have a dynamic range of 40:1 (32 dB). At least some examples disclosed herein provide, for example, a dynamic range of 1500:1 (63 dB) or better, while maintaining 1% accuracy.

The primary requirement of "accuracy" refers to an amount of error of a RF detector over a dynamic range of the RF detector. Fundamentally, "accuracy" is analogous to "linearity" in a linear RF detector since offset and gain may be easily calibrated and/or adjusted. An example accuracy level is +/−1% error. At least some of the examples disclosed herein provide an accuracy level of +/−1% or better. Linearity is a measure of the differences between changes in actual RF values and corresponding changes in detected RF values. Linearity may refer to differences between (i) a curve provided by plotting the actual RF values versus the detected RF values, and (ii) a linear line.

Examples of secondary requirements are signal flatness over a frequency bandwidth, transient response, temperature stability, within-unit repeatability, and unit-to-unit repeatability. Signal flatness over a frequency bandwidth refers to having an output voltage change of less than a predetermined threshold over a range of operating frequencies of, for example, a RF generator. An RF generator may have different and/or large tuning ranges and manufactured RF detectors need to be designed appropriately for these different tuning ranges. This assures that a change in an output voltage (or current) of a RF detector is due to a voltage (or current) change in a RF input signal and not due to a change in frequency of the RF input signal. If the output of the RF detector changed due to frequency, then another source of error is effectively introduced. A transient response refers to how quickly a RF detector changes in response to a change in a RF input signal. A transient response of a RF detector typically needs to be quick enough to react to RF pulsing.

The examples disclosed herein include RF RMS detector circuits that achieve high-dynamic ranges and high-linearity for RF amplitude measurements with low error. The RF RMS detector circuits perform RF-to-DC conversions via analog front ends. The resulting DC signals may then be detected and/or monitored via a back end. The resulting DC signals are representative of RMS voltages of RF input signals. RMS-to-peak conversions may be performed mathematically assuming sinusoidal signals.

FIG. 1 shows a plasma processing system 10 that includes a plasma processing chamber 12 and a transformer coupled plasma (TCP) coil 14. The TCP coil 14 is disposed outside and above the plasma processing chamber 12. The first power source 16 provides a first RF source signal. A first match network 18 is included between the first power source 16 and the TCP coil 14. The plasma processing chamber 12 includes a ceramic window 19, which is located adjacent the TCP coil 14 and allows efficient transmission of the first RF source signal into the plasma processing chamber 12 for plasma generation purposes.

The plasma processing system 10 further includes a substrate support 20 such as an electrostatic chuck, a pedestal or other suitable substrate support, located at the bottom of the plasma processing chamber 12. The substrate support 20 supports a substrate 22, which is processed in the plasma (or substrate) processing system 10. If the substrate support 20 is an electrostatic chuck, the substrate support 20 includes electrically conductive portions 24 and 26, which are electrically isolated from each other. The substrate support 20 is surrounded by an insulator 28 and is capacitively coupled to the substrate 22. By applying a DC voltage across the conductive portions 24, 26, an electrostatic coupling is created between the conductive portions 24, 26 and the substrate 22. This electrostatic coupling attracts the substrate 22 against the substrate support 20.

The plasma processing system 10 further includes a bias RF power source 30, which is connected to a second match network 32. The second match network 32 is connected between the bias RF power source 30 and the substrate support 20. The second match network 32 matches an impedance (e.g., 50Ω) of the bias RF power source 30 to an impedance of the substrate support 20 and plasma 34 in the plasma processing chamber 12 as seen by the second match network 32.

The plasma processing system 10 is provided as an example implementation of a RF detector. The RF detectors disclosed herein may be used to detect voltages/current levels at other locations than shown in FIG. 1 and may be used in other processing systems.

The plasma processing system further includes a voltage control interface (VCI) 40. The VCI 40 may include a pickup device (e.g., an electrode) 42, a RF detector 44, a controller 46 and any circuitry between the RF detector 44 and the controller 46. The pickup device 42 extends into the substrate support 20. This pickup device 42 is connected via a wire 48 to the RF detector 44 and is used to generate a RF input signal $RF_{IN}$. The RF detector 44 is configured to detect voltages and/or current levels in the RF input signal $RF_{IN}$. Although a single pickup device 42, a single wire 48 and a single RF detector 44 are shown, any number of pickup devices, wires, and RF detectors may be included. Other example The RF detector 44 generates output signals, which may be monitored and/or used to adjust a biasing RF signal (or second RF source signal) generated by the bias RF power source 30. Operation of the RF detector 44 may be monitored, manually controlled, and/or controlled via the controller 46. The controller 46 may receive and display output voltages/current levels of the RF detector 44 on a display 50. Although shown separate from the controller 46, the display 50 may be included in the controller 46. The controller 46 may receive input signals from an input device 52 and control operation of the RF detector 44 based on the input signals. Although shown separate from the controller 46, the input device 52 may be included in the controller 46. The controller 46 may control operation of the RF detector 44 based on the output signals. Examples and operation of the RF detector 44 are further described below with respect to FIGS. 2-16.

In operation, a gas capable of ionization flows into the plasma processing chamber 12 through the gas inlet 56 and exits the plasma processing chamber 12 through the gas outlet 58. The first RF signal is generated by the RF power source 16 and is delivered to the TCP coil 14. The first RF signal radiates from the TCP coil 14 through the window 19 and into the plasma processing chamber 12. This causes the gas within the plasma processing chamber 12 to ionize and form the plasma 34. The plasma 34 produces a sheath 60 along walls of the plasma processing chamber 12. The plasma 34 includes electrons and positively charged ions. The electrons, being much lighter than the positively charged ions, tend to migrate more readily, generating DC bias voltages and DC sheath potentials at inner surfaces of the plasma processing chamber 12. An average DC bias voltage and a DC sheath potential at the substrate 22 affects the energy with which the positively charged ions strike the substrate 22. This energy affects processing characteristics such as rates at which etching or deposition occurs.

The controller 46 may adjust the bias RE signal generated by the RF power source 30 to change the amount of DC bias and/or a DC sheath potential at the substrate 22. The controller 46 may compare outputs of the channels of the RF detector 44 and/or a representative value derived based on the outputs of the channels to one or more set point values. The set point values may be predetermined and stored in a memory 62 of the controller 46. The bias RF signal may be adjusted based on differences between (i) the outputs of the RF detector 44 and/or the representative value and (ii) the one more set point values. The bias RF signal passes through the second match network 32. An output provided by the second match network 32 (referred to as a matched signal)

is then passed to the substrate support 20. The bias RF signal is passed to the substrate 22 through the insulator 28.

Figure 2:
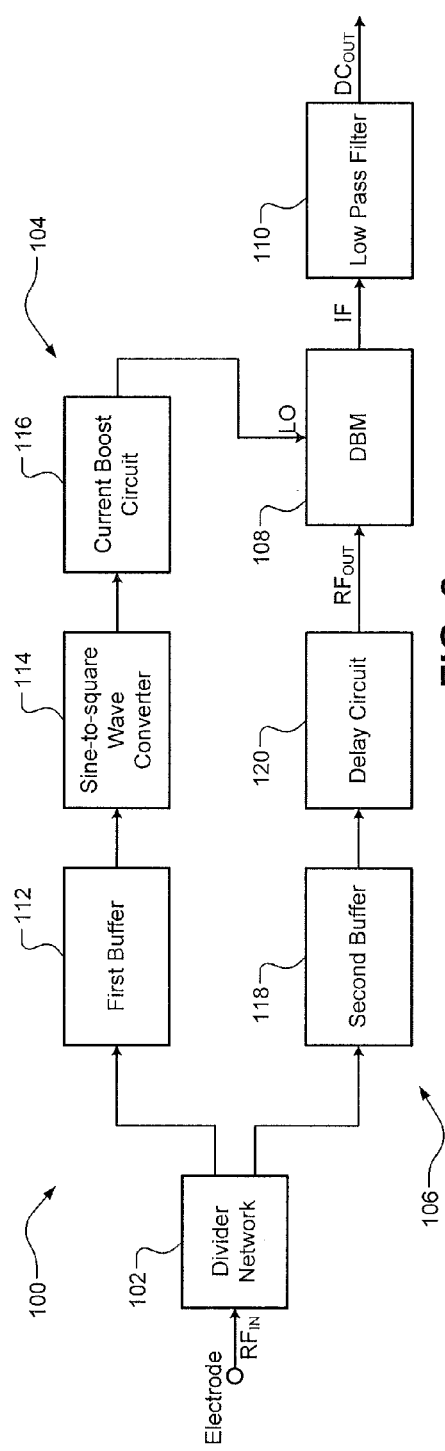
FIG. 2 is a functional block diagram of an example of a RF RMS detection circuit including a current boost circuit in accordance with the present disclosure.

FIG. 2 shows a RF RMS detection circuit 100 that includes a divider network 102, a local oscillator (LO) path 104, a RF path 106, a DBM 108 and a low pass filter 110. The LO path 104 may include a first buffer 112, a sine-to-square wave converter 114, and a current boost circuit 116. The RF path 106 may include a second buffer 118 and a delay circuit 120.

The divider network 102 may include one or more dividers and receives a RF input signal $RE_{IN}$. Each of the dividers may include two or more resistors, capacitors, coils, and/or other divider circuit elements. As an example, a pair of resistors may be connected in series. An RF input signal $RF_{IN}$ may be provided across the resistors and a lower RF voltage may be detected at a terminal between the resistors. Similarly, a pair of capacitors may be connected in series and receive the RF input signal $RF_{IN}$ and provide a lower RF voltage at a terminal between the capacitors.

High-voltage and high-current RF detectors often include one or more dividers that receive a RF input signal $RE_{IN}$ and divide down the RF input signal $RE_{IN}$ from a large voltage/current signal to a small voltage/current signal to be handled by electronic circuits downstream of the divider. The dividers may be resistor, capacitor, and/or coil based. For example a 1000:1 divider could convert 1000V to 1V. The divider ratio does not refer to the dynamic range of the RF sensor. The dividers set the scaling of the corresponding RF detector. For example, a RF sensor having a 1500:1 dynamic input range can have a voltage input range of 1-1500V, 2-3000V, 10-15000V depending on the divider(s) used. Dynamic range and accuracy of a RF detector is typically not associated with a divider, but rather is associated with the electronic circuits downstream from the divider.

The divider network 102 may include one or more dividers for attaining RF signals with different amplitudes for the LO and RF paths 102, 104. As an example, the divider network 102 may output a first RF signal to the LO path 104 that has a greater amplitude than a second RF signal output to the RF path 106.

The buffers 112, 118 may be analog amplifier buffers and include respective operational amplifiers and buffer the outputs of the divider network 102. The first buffer 112 may have a same delay as the second buffer 118. The sine-to-square wave converter 114 converts a sine wave received from the first buffer 112 to a square wave. The sine-to-square wave converter 114 may include or be implemented as, for example, a limiter or a high-speed comparator. As an example, the high-speed comparator may compare a received RF signal to a reference threshold. An output of the high-speed comparator may transition HIGH when the amplitude of the RE signal exceeds the reference threshold. The output may transition LOW when the RF signal is below the reference threshold.

Figure 15:
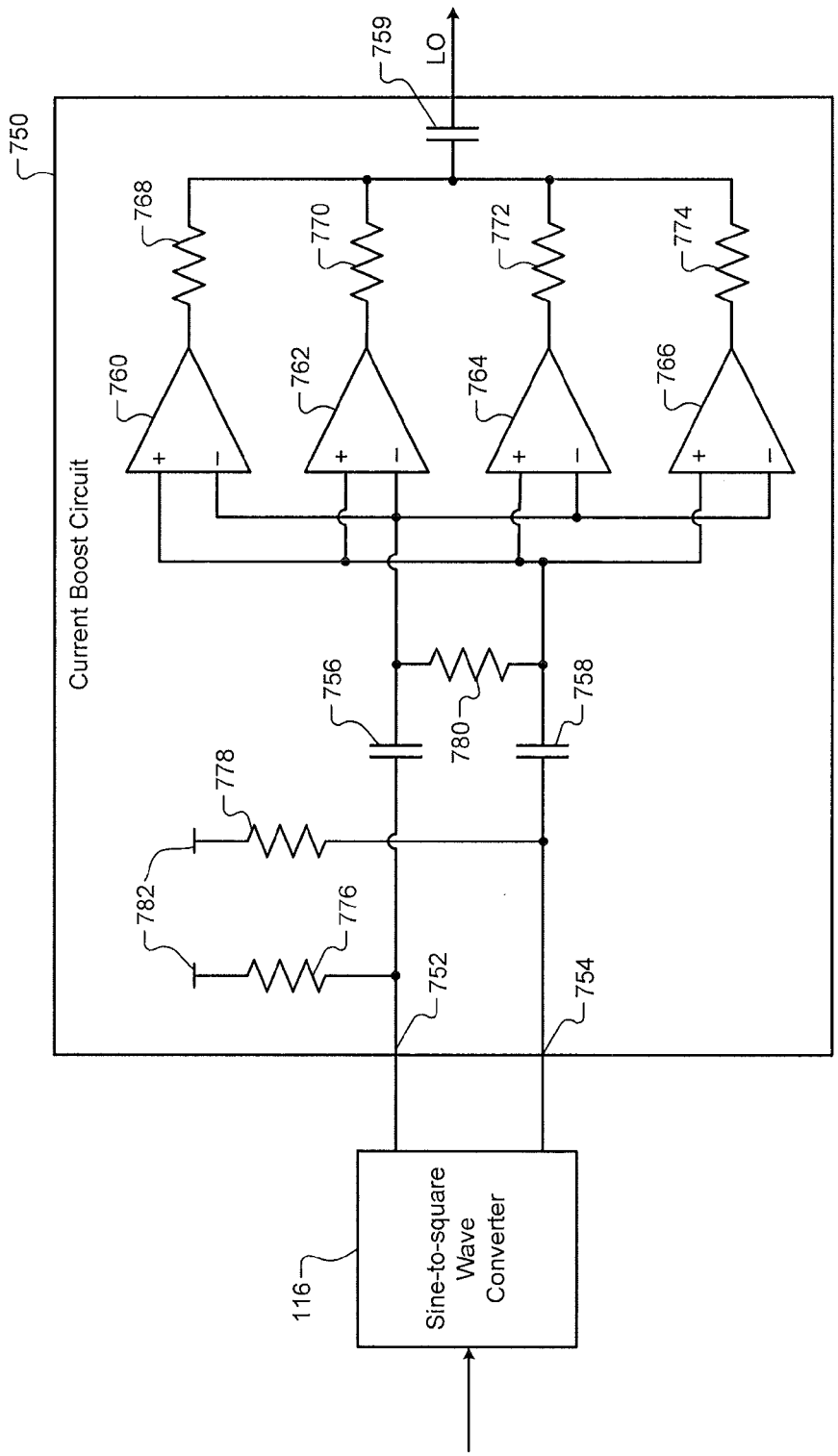
FIG. 15 is a schematic view of an example of a current boost circuit in accordance with an embodiment of the present disclosure.

The current boost circuit 116 increases a current level of the square wave signal output of the sine-to-square wave converter 114. This increases strength of the square wave signal. The current boost circuit 116 may be implemented as a low voltage differential signaling (LVDS)-to-transistor-to-transistor logic (TTL) converter. The output of the current boost circuit 116 is a local oscillator signal LO, which is provided to the DBM 108. An example of the current boost circuit 116 is shown in FIG. 15.

The delay circuit 120 delays an output of the second buffer 118. The output of the delay circuit is a RF output signal $RF_{OUT}$. The delay of the delay circuit 120 is equal to a sum of delays caused by the sine-to-square wave converter 114 and the current boost circuit 116. This assures that the outputs of the buffers 112, 118, which are represented by the signals LO, $RF_{OUT}$, are received at the DBM at the same time. In other words, the signals LO, $RF_{OUT}$ are in-phase with one another. In one embodiment, the signals LO, $RF_{OUT}$ are 180° out-of-phase.

The DBM 108 provides a wide dynamic range and linearity. Examples of the DBM 108 are shown in FIGS. 9 and 11-13. As an alternative to the DBM 108, a linear multiplier may be used as shown in FIG. 10. The DBM 108, such as that shown in FIGS. 9 and 11-13, is operated in a saturated mode. The saturated mode occurs when driving the signal LO with a stronger (higher current level) than the signal $RF_{OUT}$. The DBM 108 is not used as a phase detector. The DBM 108 is used to create a direct current (DC) output, which is representative of the signal $RF_{OUT}$. The DBM 108 outputs an intermediate frequency signal IF, which is filtered by the low pass filter 110. The signal IF is a half-wave rectified version of the signal $RF_{OUT}$. The low pass filter 110 filters the signal IF to remove high-order frequency components and provide a DC output signal $DC_{OUT}$. RF pulse performance of an output of the RF RMS detector 100 is based on operation of the low pass filter 110. RF pulse performance of the RF RMS detector 100 is improved over analog-based RF detectors that include operational amplifiers and diodes because there is no waiting for amplifiers to stabilize diode operating points. In one embodiment, one or more of the low pass filters 158, 162 are replaced with bandpass filters for selective RF frequency operation.

RF diodes exhibit nonlinearity with small amplitude signals, analogous to the issues that limit dynamic ranges of traditional high voltage RF VI probes. When the amplitudes are too small, the RF diodes are completely turned OFF. As the amplitudes increase, the RF diodes start to conduct and enter a nonlinear region, but do not operate as ideal switches. Although some RF detectors take advantage of this nonlinear region of operation, since power is effectively being measured and not voltage amplitude, significant mathematical processing is required and secondary difficulties of handling the non-linear to linear transition can occur. For large amplitude signals, the RF diodes are fully ON and operate as linear RF detectors.

A diode bridge ring (e.g., such as that provided by a Schottky diode ring) compensates for nonlinearities in RF diodes since the diode bridge ring balances nonlinearities amongst two branches. The DBM 108 may include a diode bridge ring, as further described below.

Each of the DBMs disclosed herein include 3 terminals; a first input terminal that receives signal LO, a second input terminal that receives signal $RF_{OUT}$, and an output terminal that outputs signal IF. The signal IF may be represented by equation 1 when the DBM has a saturated LO path (i.e. when $V_{LO} \gg V_{RF}$), where $V_{LO}$, $\omega_{LO}$ and $\phi_{LO}$ are the voltage, frequency and phase of signal LO, where $V_{RF}$, $\omega_{RF}$, $\phi_{RF}$ are the voltage, frequency and phase of signal RF, and where $V_{IF}$ is the voltage of signal IF.

$$V_{IF} = \left(\frac{1}{2} V_{RF} V_{LO} \cos[(\omega_{LO} - \omega_{RF})t - (\phi_{LO} - \phi_{RF})]\right) + \left(\frac{1}{2} V_{RF} V_{LO} \cos[(\omega_{LO} + \omega_{RF})t + (\phi_{LO} - \phi_{RF})]\right) + HigherOrderTerms \quad (1)$$

In theory, a linear measurement of RF amplitude may be taken using the following rules: 1) fixing $V_{LO}$ to a fixed amplitude by driving the signal LO with a square wave; 2)

making $V_{LO}$ a square wave of a same frequency as $\omega_{RF}$, such that the $(\omega_{LO}-\omega_{RF})t$ term cancels; and 3) keeping the $\Delta\phi=(\phi_{LO}-\phi_{RF})$ as small as possible (e.g., at 0°), as close to 180° as possible, or as close to an integer multiple of 180°. With these rules applied, equation 1 may be simplified to equation 2

$$V_{IF} = \left(\frac{1}{2}V_{RF}V_{LO}\right) + \left(\frac{1}{2}V_{RF}V_{LO}\right) \cdot (\cos 2\omega t) + HigherOrderTerms \quad (2)$$

When followed with a filter, such as a low pass filter or a band pass filter, equation 2 may be simplified to equation 3.

$$V_{IF} = \left(\frac{1}{2}V_{RF}V_{LO}\right) + HigherOrderTerms \quad (3)$$

Hence with a fixed amplitude $V_{LO}$, a linear measurement of the amplitude of $V_{RF}$ is achieved. The higher order terms have minimal effect on linearity. For example, the effect of higher order terms on linearity is negligible for dynamic ranges equal to or smaller than 1500:1.

A saturated LO path causes a DBM to operate as a phase detector exhibiting output voltage variation as a function of a phase difference between signals RF and LO. This means a phase difference between signals RF and LO yields an output voltage error that reduces RF detector accuracy. Since the above described equations depend on cos ($\Delta\phi$), by having $\Delta\phi$ equal to 0°, 180°, or a multiple of 180° phase immunity is improved. Although phase shift should only be a static gain error (hence easily calibrated out), secondary drifts can result in more error. Hence, the RF RMS detectors described herein are configured and operated, such that $\Delta\phi$ is equal or within a predetermined range of 0°, 180°, or an integer multiple of 180°. Delay circuits, amplifiers, drivers, sine-to-square wave converters, and other circuit elements are provided, such that $\Delta\phi$ is equal to 0°, 180°, or an integer multiple of 180°.

High-end dynamic range may be based on inputs of the DBM 108 including component maximum, nonlinear spurs, crosstalk, and drive-strength between LO and RF ports of the DBM 108. If the signal $RF_{OUT}$ is too large, the LO square wave is not strong enough to put the DBM 108 into the saturated mode. In addition, sine-to-square wave converters (e.g., limiters) may degrade in performance as a drive current of the sine-to-square wave converters increases. Providing a current gain in the LO path is beneficial for a high-end range by providing additional LO drive strength. The current gain in the LO path also minimizes low-end limiter noise and potentially increases low-end range. To improve strength of the LO square wave, the current boost circuit 116 is included. The current boost circuit 116 may be implemented as a LVDS-to-TTL driver, high-speed analog comparators, digital drivers, and/or current boosting logic chips. A high-end dynamic range may be provided via a double-balanced mixer with additional diodes legs of a bridge ring, as shown in FIG. 11. This may require more LO drive strength, but operate with a higher input signal range.

The DBM 108 may be implemented as shown in FIGS. 9 and 11-13 or may be replaced with a linear mixer as shown in FIG. 10, and/or other LO/RF-to-IF conversion circuits. The LO/RF-to-IF conversion circuits may include double balanced mixers of various power levels, mixers with additional diodes in legs of the mixers, diode arrays, linear multipliers, FET mixers, transistor arrays, and analog/FET switches.

Figure 3:
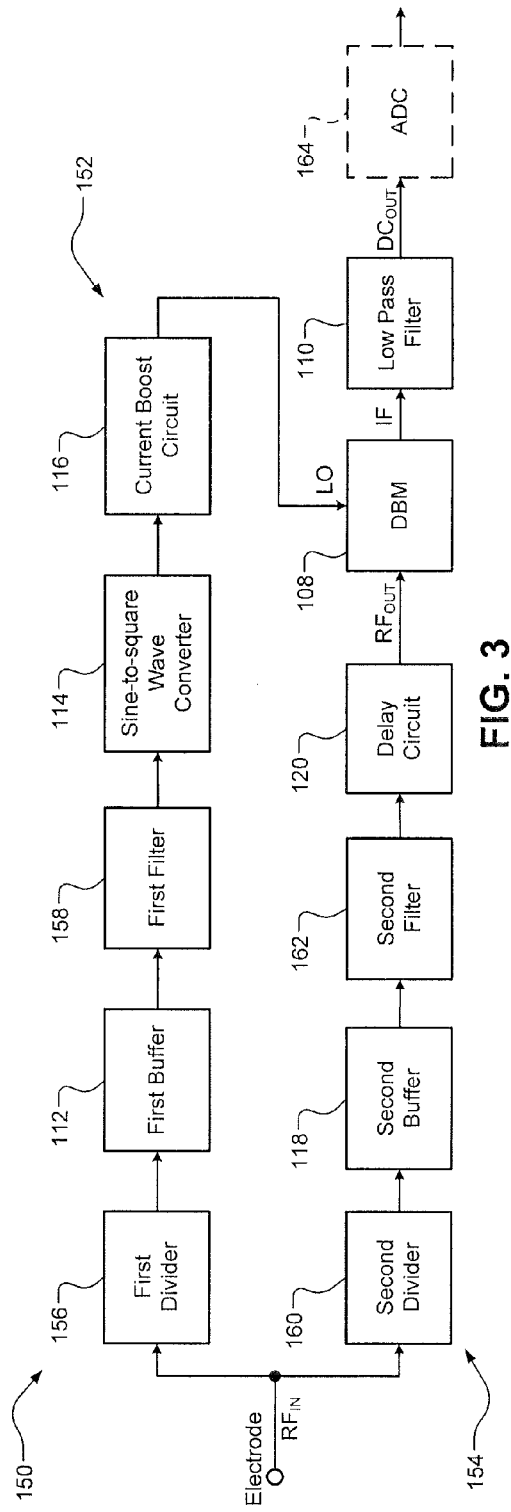
FIG. 3 is a functional block diagram of an example of another RF RMS detection circuit including respective dividers for LO and RF paths in accordance with the present disclosure.

FIG. 3 shows a RF RMS detection circuit 150 that includes a LO path 152, a RF path 154, the DBM 108 and the low pass filter 110 including respective dividers for LO and RF paths. The LO path 152 may include a first divider 156, a first buffer 112, a first filter 158, the sine-to-square wave converter 114 and the current boost circuit 116. The RF path 154 may include a second divider 160, the second buffer 118, a second filter 162, and the delay circuit 120. The dividers 156, 160 may be resistor, capacitor and/or coil based.

The dividers 156, 160 have divider ratios respectively set for the paths 152, 154. As an example, the first divider 156 may be a divide by 2 divider and the second divider 160 may be a divide by 4 divider. This maximizes dynamic range of the LO path 152 including the sine-to-square wave converter 114 and minimizes an amount of amplification added downstream of the sine-to-square wave converter 114. The second divider 160 has the same delay as the first divider 156.

The filters 158, 162 may be frequency filters and used to select a frequency to track. The filters 158, 160 may attenuate other harmonic content not being monitored to minimize noise/error sources. As an example, the filters 158, 162 may be bandpass filters and used to select a narrow band of frequencies to monitor. Although not shown in FIG. 3, outputs of the filters 158, 162 may be buffered to minimize circuit loading on the filters 158, 162. For example, a buffer may be connected between the first filter 158 and the sine-to-square wave converter 114. Another buffer may be connected between the second filter 162 and the delay circuit 120. The second filter 162 has the same delay as the first filter 158. The filters 158, 162 are selected to provide balance and symmetry between LO and RF paths to minimize phase errors.

The output of the RF RMS detector circuit 150 once filtered by the low pass filter 110 is a DC representation of a RF RMS voltage. An analog-to-digital converter (ADC) may be added and averaging and/or digital signal processing may be performed to improve resolution. As an example, an ADC 164 is shown.

Figure 4:
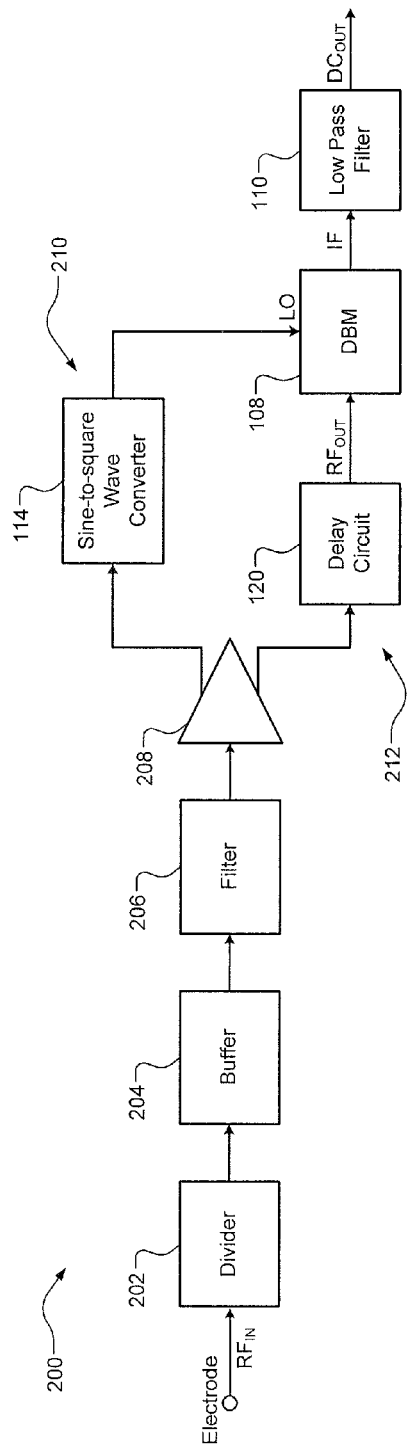
FIG. 4 is a functional block diagram of an example of another RF RMS detection circuit including a minimal number of circuit devices in LO and RF paths in accordance with the present disclosure.

FIG. 4 shows a RF RMS detection circuit 200 that includes a divider 202, a buffer 204, a filter 206, an amplifier 208 having a single ended input and a differential output. The differential output is provided to a LO path 210 and a RF path 212. The LO path 210 includes the sine-to-square wave converter 114. The RF path 212 includes the delay circuit 120. The divider 202 may be configured similar to one of the dividers 156, 160 of FIG. 2. The buffer 204 may be configured similar to one of the buffers 112, 118 of FIG. 2. The filter 206 may be configured similar to one of the filters 158, 160 of FIG. 2. The delay circuit 120 has a same delay as the sine-to-square wave converter 114. The configuration of the RF RMS detection circuit 200 minimizes numbers of circuit devices in the LO path 210 and the RF path 212. This minimizes the potential amount of difference in delays between the LO path 210 and the RF path 212.

The amplifier 208 is a single-ended-to-differential amplifier that drives different loads provided via the LO and RF paths 210, 212. Instead of using dividers or a single-ended-to-differential amplifier to split a signal path into LO and RF paths, a transformer may be used. As an example, a primary winding of the transformer may receive a buffered, filtered and/or amplified RF signal. One or more secondary windings of the transformer may output a LO signal and a RF signal.

Low-end dynamic range may be based on signal fidelity, circuit noise, or external system noise. External system noise may be reduced with proper filtering. This filtering may be provided prior to the RF/LO split, such as the filtering provided by the filter 206. Lower-noise components leads to higher dynamic range by extending the low-end, until limitations from DBM linearity are reached.

Figure 5:
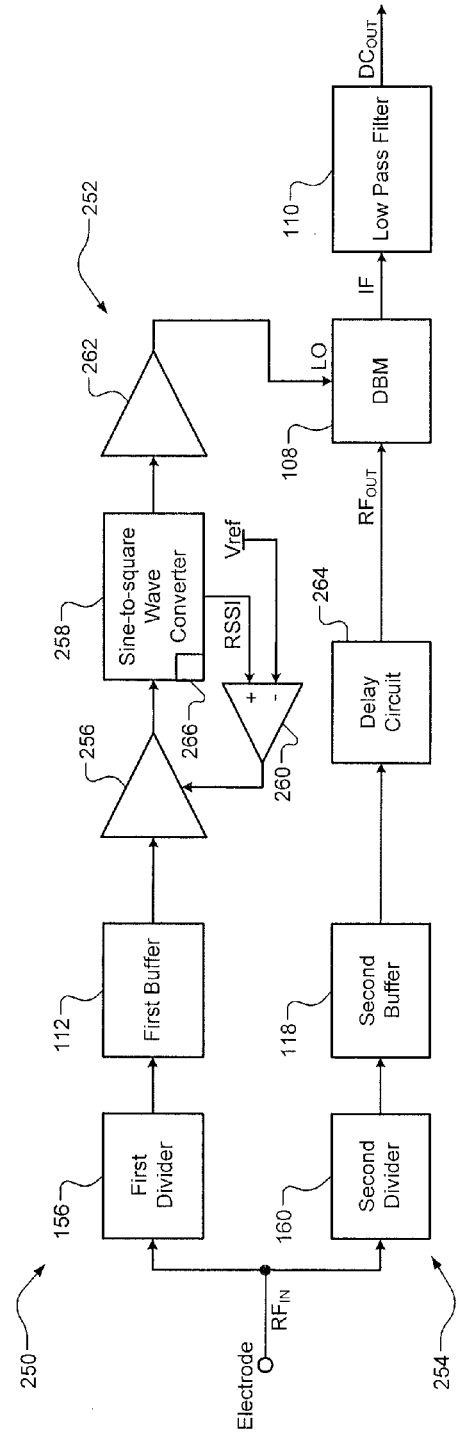
FIG. 5 is a functional block diagram of an example of another RF RMS detection circuit including a variable gain amplifier with feedback gain control in a LO path in accordance with the present disclosure.

FIG. 5 shows a RF RMS detection circuit 250 that includes a LO path 252, a RF path 254, the DBM 108 and the low pass filter 110. The LO path 252 includes the first divider 156, the first buffer 112, a variable gain amplifier 256, a sine-to-square wave converter 258, a feedback amplifier 260, and a driver 262. The RF path 254 includes the second divider 160, the second buffer 118, and a delay circuit 264.

The sine-to-square wave converter 258 may operate similarly as the sine-to-square wave converter 114 of FIGS. 1-4. The sine-to-square wave converter 258 includes a received signal strength indicator (RSSI) output that indicates a signal strength of a signal received from the variable gain amplifier 256 at the sine-to-square wave converter 258. The RSSI signal is fed back to the feedback amplifier 260. The feedback amplifier 260 compares the RSSI signal to a reference voltage $V_{ref}$ and generates a feedback gain signal. Gain of the variable gain amplifier 256 is adjusted based on the feedback gain signal. The variable gain amplifier 256 amplifies or attenuates the output of the first buffer 112. This provides feedback gain control in a LO path 252. The driver 262 is an example of the current boost circuit 116 of FIG. 2. The driver 262 may be replaced with the current boost circuit 116. The driver 262 may be a current and/or voltage amplifier and is provided to strengthen the square wave output of the sine-to-square wave converter 258. The driver 262 aids in driving the DBM. By having the output of the sine-to-square wave converter 258 have a low-level of current and boosting the level of current with the driver 262, performance of the sine-to-square wave converter 258 may be improved to exhibit less noise coupling.

The delay circuit 264 has a delay that may be equal to a sum of delays of the variable gain amplifier 256, the sine-to-square wave converter 258 and the driver 262. This assures that the outputs of the buffers 112, 118, represented by signals LO, $RF_{OUT}$, are received at the DBM 108 at the same time.

If the input dynamic range of a sine-to-square wave converter of a RF RMS detector is a limiting factor of dynamic range performance, primarily on the low-end, gain can be introduced in a LO path to increase dynamic range performance. For example, a variable-gain amplifier may be included as shown in FIG. 5 in the LO path to extend dynamic range of tracking of the sine-to-square wave converter. Gain-control is provided by close-loop control via a RF RSSI output of the sine-to-square wave converter (e.g., a limiter). Nonlinearities in the variable-gain amplifier are compensated for by the corresponding DBM. The additional phase shift introduced by the variable-gain amplifier is accounted for by one or more delay circuits in the LO and/or RF paths.

Another approach to increasing dynamic range performance is to include separate dividers for LO and RF paths with different gains. A higher gain may be provided in the LO path than provided in the RF path. This may be done for providing a high-end dynamic range. A high-gain may be provided in the LO path including diodes to clamp the corresponding voltage for maximum sine-to-square wave tracking, as shown in FIG. 14. Clamp diodes exhibit fast recovery. Linearity in the LO path is not of significant importance, since it is made square prior to application to the DBM. The RF path linearity is more important than the linearity in the LO path. The dividers may be multi-stage resistor and/or capacitor based dividers. Amplifiers may be included in the LO and RF paths to provide the different gains.

Because a sine-to-square wave converter may operate similar as a high-gain open-loop amplifier, stability may be compensated for and noise may be minimized by using a RSSI sensor. The RSSI sensor may be incorporated into the sine-to-square wave converter. As an example, a RSSI sensor 266 is shown and is used to generate the RSSI signal. When at, near or below a low-end of a dynamic range the RF RMS detector, the RF input signal may be too small to provide a consistent output of 0V. This may be corrected by selecting a minimum operating range for the RF RMS detector and, when at, near or below the low-end of the dynamic range: shutting OFF the sine-to-square wave converter; decreasing drive current of the sine-to-square wave converter with a control loop; or having the RF RMS detector digitally report 0V.

Figure 6:
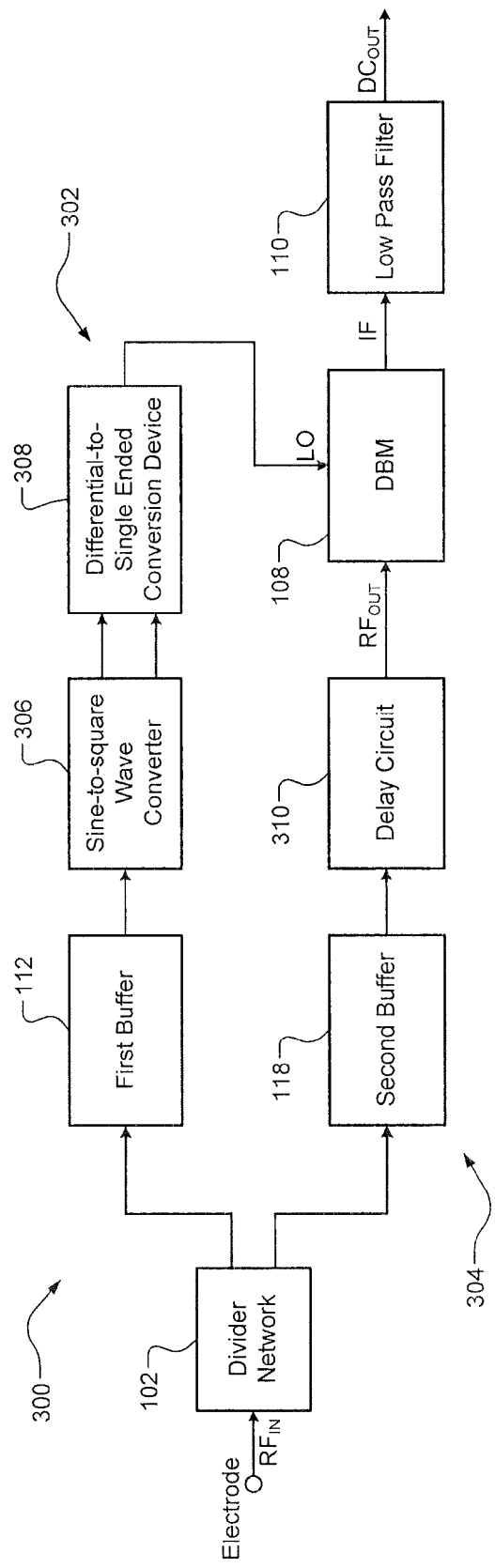
FIG. 6 is a functional block diagram of an example of another RF RMS detection circuit including a differential-to-single ended conversion device downstream from a sine-to-square wave converter in a LO path in accordance with the present disclosure.

FIG. 6 shows a RF RMS detection circuit 300 that includes the divider network 102, a LO path 302, a RF path 304, the DBM 108 and the low pass filter 110. The LO path 302 includes the first buffer 112, a sine-to-square wave converter 306 and a differential-to-single ended conversion device 308. The RF path 304 includes the second buffer 118 and a delay circuit 310. The differential-to-single ended conversion device 308 is located downstream from the sine-to-square wave converter 306. The sine-to-square wave converter 306 has a single ended input and a differential output. The differential output is converted to a single ended output via the differential-to-single ended conversion device 308. The delay circuit 310 has a same amount of delay as a combination of the sine-to-square wave converter 306 and the differential-to-single ended conversion device 308. The DBM 108 receives signals LO and $RF_{OUT}$ from the differential-to-single ended conversion device 308 and the delay circuit 310.

The sine-to-square wave converter 306 outputs a square wave on a first output port and an inverse of the square wave on a second output port. The two square waves provide the differential output that is received at the differential-to-single ended conversion device 308. The differential-to-single ended conversion device 308 outputs a single square wave, which may have greater peak amplitudes that the square waves output by the sine-to-square wave converter 306. The differential-to-single ended conversion device 308 has a low output impedance and increases current level of the differential output signal to provide the signal LO. The differential-to-single ended conversion device 308 may include a LVDS-to-TTL converter, an analog amplifier, digital logic devices, and/or a transformer. As an example, the transformer may include a primary winding and a secondary winding. The primary winding may receive the differential signal. A first end of the secondary winding may output the signal LO and a second end of the secondary winding may be connected to a ground reference terminal. As an example, the digital logic devices may include a buffer, an inverter, an AND gate and/or an OR gate.

Figure 7:
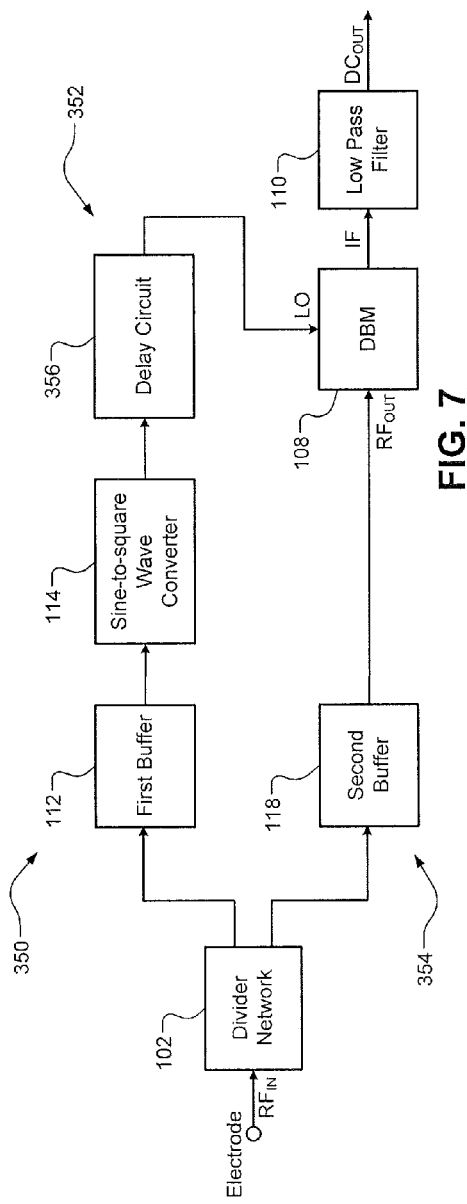
FIG. 7 is a functional block diagram of an example of another RF RMS detection circuit including a delay circuit downstream of a sine-to-square wave converter in a LO path in accordance with the present disclosure.

FIG. 7 shows a RF RMS detection circuit 350 that includes the divider network 102, a LO path 352, a RF path 354, the DBM 108 and the low pass filter 110. The LO path 352 includes the first buffer 112, the sine-to-square wave converter 114 and a delay circuit 356. The RF path 354 includes the second buffer 118. The delay circuit 356 may be an analog or digital delay circuit and delay the output of the sine-to-square wave converter 114, such that the output of the delay circuit 356 is 180° relative to the output of the second buffer 118. In other examples, the delay circuit 356 may delay the output of the sine-to-square wave converter 114 by an integer multiple of 180° out-of-phase with the output of the second buffer 118. In these examples, a delay circuit is provided in a LO path instead of in a RF path. In other examples, a delay circuit is provided in both the LO path and the RF path, such that the signal LO is in-phase with the signal $RF_{OUT}$, a 180° out-of-phase with the signal $RF_{OUT}$, or an integer multiple of 180° out-of-phase with the signal $RF_{OUT}$.

FIG. 7 shows a delay circuit in a LO path rather than in a RF path. Delay circuits may be provided in LO and RF paths and may each be implemented as a transmission line or as one or more discrete delay elements. The delay circuits result in $\Delta\phi=0$ or $\Delta\phi=180°$ (or any integer multiple thereof). Since the signal LO is essentially a square wave, a digital delay may be introduced in the LO path. This allows the phase shift to be tunable and/or calibratable to re-align the phase difference between the RE and LO paths.

Figure 8:
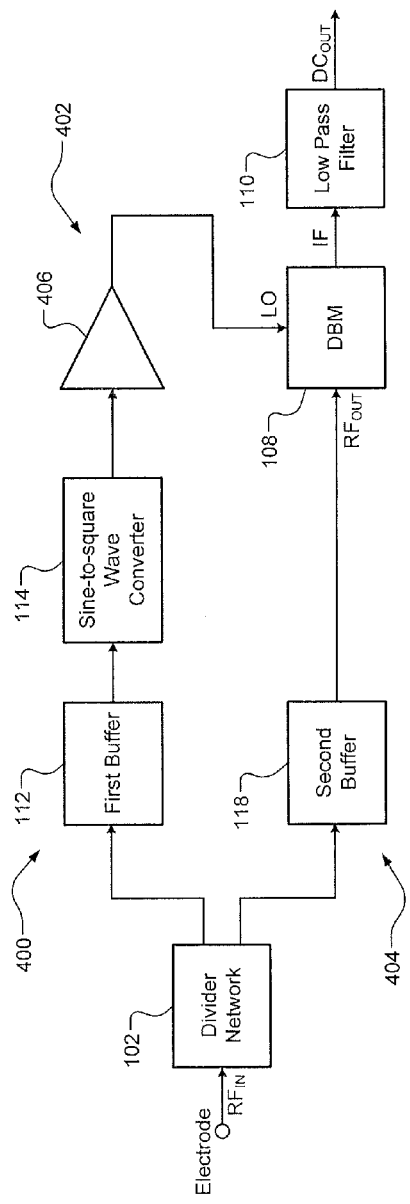
FIG. 8 is a functional block diagram of an example of another RF RMS detection circuit including a driver downstream of a sine-to-square wave converter in a LO path in accordance with the present disclosure.

FIG. 8 shows a RF RMS detection circuit 400 that includes the network divider 102, a LO path 402, a RF path 404, the DBM 108 and the low pass filter 110. The LO path 402 may include the first buffer 112, the sine-to-square wave converter 114 including a driver 406. The driver 406 may increase a current level of the LO signal out of the sine-to-square wave converter 114. The RF path 404 may include the second buffer 118. The sine-to-square wave converter 114 may include high-speed logic devices and/or an analog comparator. In one embodiment, the sine-to-square wave converter is a fast, bridge-switched synchronous rectifier-based AC-to-DC converter, such as that shown in FIG. 50 of "Bridge Circuits" by Jim Williams, Linear Technology AN-43 pages 32-34, which is incorporated herein by reference in its entirety.

The following FIGS. 9-13 illustrate use of different DBMs and mixers, which may be used to replace the DBMs of FIGS. 2-8. FIG. 9 shows a portion of RF RMS detection circuit 450 that includes the divider network a LO path 452, a RF path 454 and a DBM 456. The LO path 452 includes the first buffer 112 and the sine-to-square wave converter 114. The RF path 454 includes the second buffer 118 and may include the delay circuit 120. The delay circuit 120 may have a same delay as the sine-to-square wave converter 114. The DBM 456 includes a first transformer 458, a bride ring 460, and a second transformer 462. Although the DBM 456 is configured as a phase detector, the DBM is not operated as a phase detector, but rather is operated in a saturated mode and is used to monitor the signal $RF_{OUT}$.

The first transformer 458 is connected between the output of the sine-to-square wave converter 114 and the bridge ring 460 (e.g., a Schottky diode ring). The first transformer 458 includes a primary winding 464 that is connected between the output of the sine-to-square wave converter 114 and a ground reference 466. The first transformer 458 also includes secondary windings 468. A center tap between the secondary windings 468 is connected to the ground reference 466. The secondary windings 468 are connected in series between a first pair of terminals of the bridge ring 460. The first transformer converts a first voltage signal to a second voltage signal.

The second transformer 462 includes a primary winding 470 and secondary windings 472. The primary winding 470 is connected between the output of the delay circuit 120 and the ground reference 466. The secondary windings 472 are connected in series between a second pair of terminals of the bridge ring 460. The second transformer converts a third voltage signal to a fourth voltage signal (or the signal IF).

FIG. 10 shows a RF RMS detection circuit 500 that includes the divider network 102, the first buffer 112, the sine-to-square wave converter 114, the second buffer 118, and a linear multiplier 502. The linear multiplier 502 receives the signals LO and $RF_{OUT}$ and outputs the signal IF. The RF RMS circuit 500 may include the delay circuit 120.

FIG. 11 shows a RF RMS detection circuit 550 that includes the divider network 102, the first buffer 112, the sine-to-square wave converter 114, the second buffer 118 and a DBM 552. The DBM 552 is similar to the DBM 456 of FIG. 9, except that each leg of a bridge ring 554 includes two diodes 556, instead of one diode. The DBM 552 includes a first transformer 558 and a second transformer 560, which are configured similarly as the transformers 458 and 462 of FIG. 9.

FIG. 12 shows a RF RMS detection circuit 600 that includes the divider network 102, the first buffer 112, the sine-to-square wave converter 114, the second buffer 118 and a DBM 602. The DBM 602 includes a first transformer 604, FETs 606, 608, 610, 612 and a second transformer 614. The FETs 606, 608 are connected in series, where the secondary windings of the first transformer 604 are connected across the FETs 606, 608. The FETs 610, 612 are connected in series, where the secondary windings of the second transformer 614 are connected across the FETs 610, 612. Control terminals of the FETs may be controlled by the controller 46 of FIG. 1.

FIG. 13 shows a RF RMS detection circuit 650 that includes the divider network 102, the first buffer 112, the sine-to-square wave converter 114, the second buffer 118 and a DBM 652. The DBM 652 includes a first transformer 654, a diode array 656, and a second transformer 658. The first transformer 654 includes a primary winding 660 and secondary windings 662, 663. The secondary windings 662, 663 are connected in series. A center terminal 665 is connected to first ends of the windings 662, 663 are connected to a ground reference 667. The diode array 656 includes diodes 664, 666, 668, 670 connected in series, such that each of the cathodes of the diodes 664, 666, 668, 670 is connected to a next successive one of the anodes of the diodes 664, 666, 668, 670 in the series. A second end of the secondary winding 662 is connected to an anode of the diode 666. A second end of the secondary winding 663 is connected to the cathode of the diode 664 and to the anode of the diode 670.

The second transformer 658 includes a primary winding 672 and secondary windings 674, 676. The anode of diode 664 is connected to a first end of the secondary winding 674. The anode of diode 670 is connected to a first end of the secondary winding 676. Second ends of the secondary windings 674, 676 are connected to an output terminal 678 that outputs signal IF.

FIG. 14 shows a RF RMS detection circuit 700 that includes the divider network 102, a LO path 702, RF path 704, the DBM 108 and the low pass filter 110. The LO path 702 includes the first buffer 112, a first amplifier 705, a first pair of clamp diodes 706, 708, a second amplifier 710, a second pair of clamp diodes 711, 712, and the sine-to-square wave converter 114. Although two amplifier/clamping diode sets are shown, any number of amplifier/clamping diode sets may be included.

The first pair of diodes 706, 708 is connected in series between a voltage supply terminal 722 at a reference voltage and a ground reference 726. The output of the first amplifier 705 and the input of the second amplifier 710 are connected to the anode of the diode 706 and the cathode of the diode 708. The second pair of diodes 711, 712 is connected in series between the voltage supply terminal 722 and the ground reference 726. The first amplifier 705 may amplify an output of the first buffer 112. The second amplifier 710 amplifies an output of the first amplifier 705. The output of the second amplifier 710 is provided as an input to the sine-to-square wave converter 114.

The RF path 704 includes the second buffer 118 and a delay circuit 720. The delay circuit 720 may have a same delay as a sum of the delays of the amplifiers 705, 710 and the sine-to-square wave converter 114.

FIG. 15 shows a current boost circuit 750 that receives an output of the sine-to-square wave converter 114 as a differential input. The current boost circuit 750 includes differential inputs 752, 754, capacitors 756, 758, 759, amplifiers 760, 762, 764, 766, and resistors 768, 770, 772, 774, 776, 778, 780. The differential input terminals 752, 754 are connected to respective inputs of capacitors 756, 758. An output of the capacitor 756 is connected to inverting inputs of the amplifiers 760, 762, 764, 766. An output of the capacitor 758 is connected to non-inverting inputs of the amplifiers 760, 762, 764, 766. An input of the capacitor 759 is connected to outputs of the amplifiers 760, 762, 764, 766. An output of the capacitor 759 outputs the signal LO with a boosted level of current. The resistor 776 is connected between a voltage supply terminal 782 and the terminal 752. The resistor 778 is connected between a voltage supply terminal 782 and the terminal 754. The resistor 780 is connected between the outputs of the capacitors 756, 758.

Figure 16:
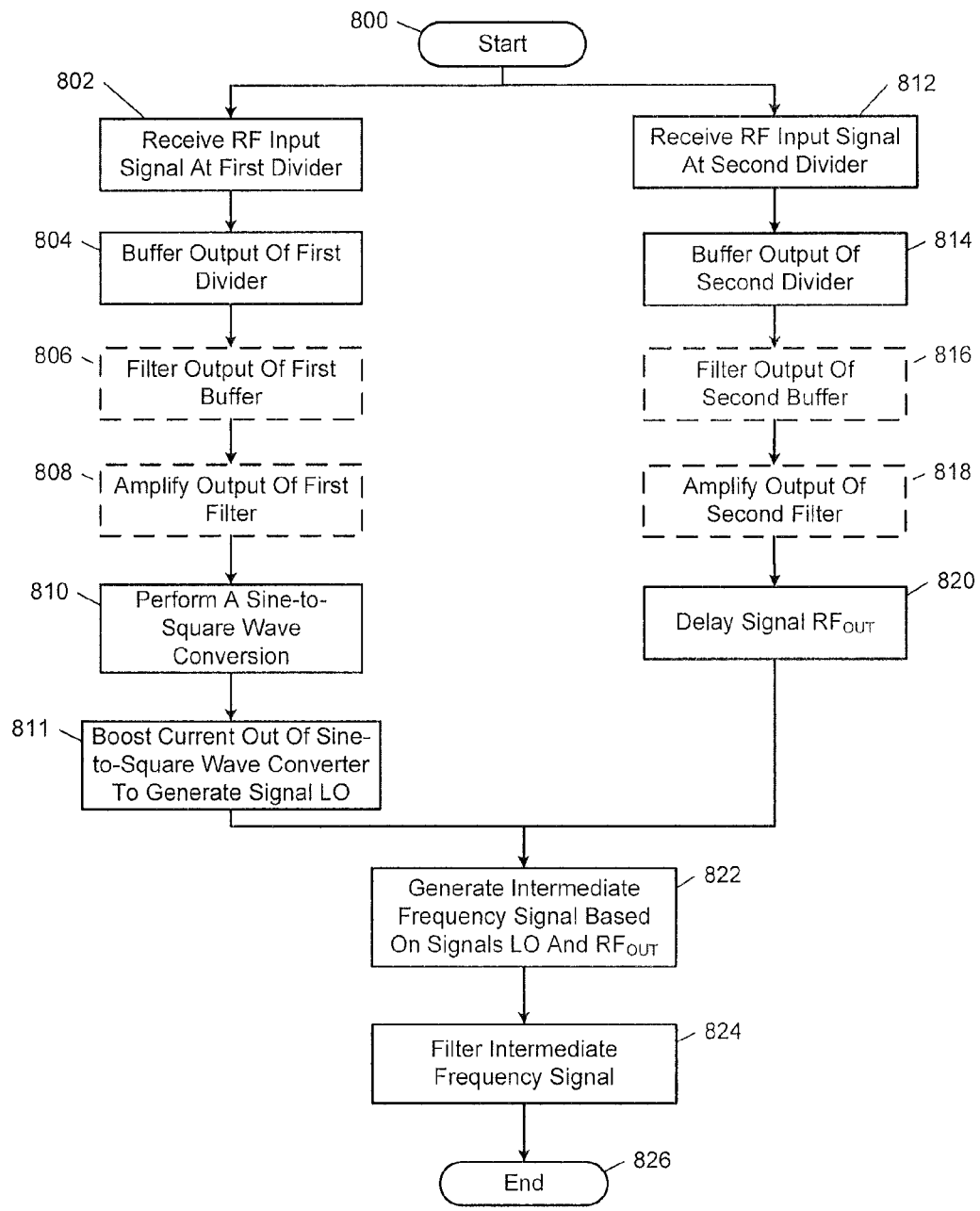
FIG. 16 illustrates a method of operating a RF RMS detection circuit in accordance with the present disclosure.

FIG. 16 shows a method of operating a RF RMS detection circuit (e.g., any one of the RF RMS detection circuits disclosed herein). The following operations may be iteratively performed. The method may begin at 800. Although the following operations 802, 804, 806, 808, 812, 814, 816, 818 are described as separate operations, operations 802, 804, 806, 808 may be combined with operations 812, 814, 816, 818, respectively, to provide operations A, B, C, D. A received RF input signal may be split into LO and RF paths prior to performing operation A. Examples of the received RF input signal being split into LO and RF paths prior to operation A are shown in FIGS. 3 and 5. Other RF signals generated based on a received RF input signal may be split into LO and RF paths prior to or subsequent to performing any one of operations A, B, C, D. Examples of RF signals being split after operation A and prior to operation B is shown in FIGS. 2, 6-14. An example of splitting a RF signal into LO and RF paths after operation D is shown in FIG. 4.

The LO paths generate square waves of fixed amplitude independent of the amplitude of the RF input signal. The square waves may have a large amplitude. The signals LO output from the LO paths may be in-phase with signals RF output from the corresponding RF paths. The square waves (or LO signals with square waves) drive LO input ports of corresponding DBMs or linear mixers. A limiter or other converter, as described above, may be used to perform a sine-to-square wave conversion. A limiter is analogous to a nonlinear high-gain amplifier. Amplitude nonlinearities are irrelevant due to use of a DBM or a linear mixer. A limiter provides a wide dynamic range and a low phase shift.

The signals $RF_{OUT}$ provided to RF input ports of the DBMs or linear mixers are representative of RF input signals of interest. Hence, the signals $RF_{OUT}$ vary with amplitude along with the RF input signals. The LO paths may be phase-delayed due to use of a sine-to-square wave converter and/or other components in the LO paths. The signals $RF_{OUT}$ are also delayed to nominally match the delays of the corresponding LO paths. As an example, delay circuit or a transmission line may be included in an RF path to delay a signal $RF_{OUT}$ to nominally match a delay of a corresponding LO path.

At 802, a RF input signal is received at a first divider. The RF input signal is a high-voltage signal that is received at the first divider, which transforms, for example, a 1000V signal to a 1V signal. A single divider or a multiple staged divider may be used.

At 804, an output of the first divider is buffered via a first buffer. The first buffer aids in setting the input impedance of the RF RMS detector circuit, such that impedance of the portion of the RF RMS detector circuit downstream from the first divider and/or a second divider (referred to herein as the sensor circuit) does not negatively affect the first divider and/or the second divider. The first divider and/or second divider may be referred to as a sensor interface between the sensor circuit and, for example, a RF source. The first buffer also aids in making the sensor circuit agnostic to other types of sensor interfaces.

At 806, an output of the first buffer may be filtered via a first filter. A frequency filter can be introduced to select which frequency the sensor is to track, as well as attenuate other harmonic content which can contribute noise/errors. A bandpass filter for example may be used to select a narrow-band frequency of operation. The output of this filter may be buffered to minimize circuit loading on the first filter.

At 808, an output of the first filter may be amplified via a first amplifier. At 810, a sine wave out of the first amplifier may be converted to a square wave via a sine-to-square wave converter. At 811, a current level of the square wave signal (or local oscillator signal) may be increased via a current boost circuit to provide signal LO.

At 812, the RF input signal is received at a second divider. A single divider or a multiple staged divider may be used. At 814, an output of the second divider is buffered via a first buffer. The second buffer aids in setting the input impedance of the RF RMS detector circuit, such that impedance of the portion of the RF RMS detector circuit downstream from the first and second dividers does not negatively affect the second divider. The second buffer also aids in making the sensor circuit agnostic to other types of sensor interfaces.

At 816, an output of the second buffer may be filtered via a second filter. A frequency filter can be introduced to select which frequency the sensor is to track, as well as attenuate other harmonic content which can contribute noise/errors. A bandpass filter for example may be used to select a narrow-band frequency of operation. The output of this filter may be buffered to minimize circuit loading on the second filter.

At 818, an output of the second filter may be amplified via a second amplifier to provide signal $RF_{OUT}$. At 820, an output of the second amplifier (or signal $RF_{OUT}$) may be delayed via a delay circuit. At 822, a DBM or a linear mixer generates signal IF based on signals LO and RF, as described above.

At 824, the signal IF may be filtered via a third filter (e.g., a low pass filter). This reduces higher-order frequency components. The output of the third filter used may be detected by, for example, the controller 46. The controller 46 may operate the processing system 10 and the voltage sources 16, 30 based on the output of the third filter. The method may end at 826.

The above-described operations are meant to be illustrative examples; the operations may be performed sequentially, synchronously, simultaneously, continuously, during overlapping time periods or in a different order depending upon the application. Also, any of the operations may not be performed or skipped depending on the implementation and/or sequence of events.

Figure 17:
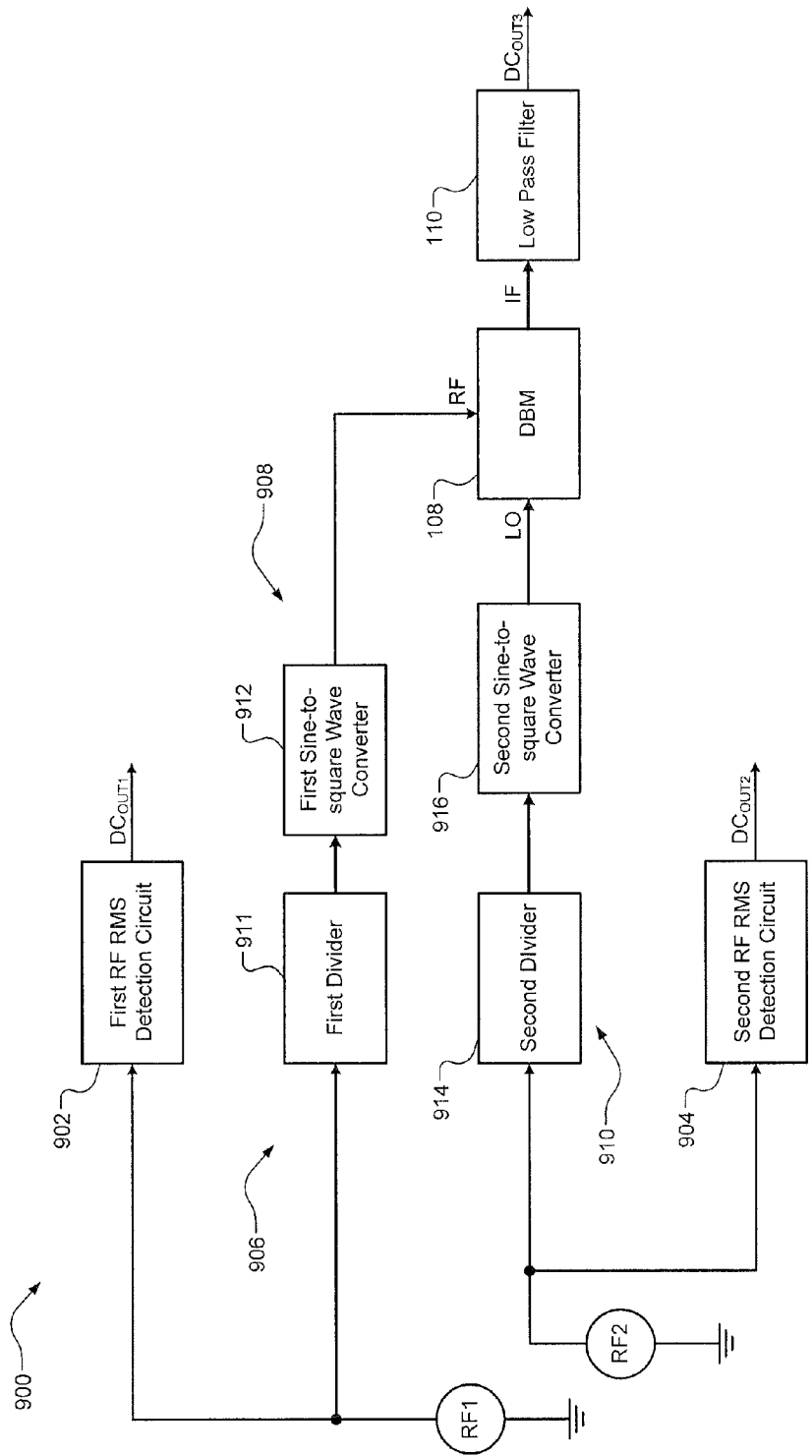
FIG. 17 is a functional block diagram of an example of a RF RMS detection system including multiple RF RMS detection circuits for amplitude detection and an RF RMS detection circuit for phase detection.

Referring now to FIG. 3 and FIG. 17, which shows a RF RMS detection system 900 that includes two RF RMS detection circuits (or RF detectors) 902, 904 for amplitude detection and a RF RMS detection circuit (or RF detector) 906 for phase detection. Each of the RF RMS detection circuits 902, 904 may be implemented as any one of the RF RMS detection circuits of FIGS. 2-14. The RF RMS detection circuits 902, 904 may output respective signals $DC_{OUT1}$, $DC_{OUT2}$, which are indicative of voltage amplitudes of RF sources RF1, RF2 and/or voltage amplitudes of RF signals provided to DBMs of the RF RMS detection circuits 902, 904. The RF sources RF1, RF2 represent RF signals detected by, for example, RF pickups (or electrodes) in substrate support 20 of FIG. 1. Any number of RF pickups (or electrodes) may be included in the substrate support 20 and each of the RF pickups may have a corresponding RF RMS detection circuit. The RF RMS detection circuits 902, 904 are operated in the saturated mode, as described above.

The RF RMS detection circuit 906 may be used to detect a phase difference between the RF signals of the RF sources RF1, RF2. Although a single RF RMS detection circuit 906 is shown, a RF RMS detection circuit may be provided for each pairing of RF sources. The output $DC_{OUT3}$ of the RF RMS detection circuit 906 is indicative of cos $\Delta\phi$, where $\Delta\phi=(\phi_{RF2}-\phi_{RF1})$, $\phi_{RF1}$ is the phase of the first RF signal of RF source RF1, and $\phi_{RF2}$ is the phase of the second RF signal of the RF source RF2. The RF RMS detection circuit 906 does not operate in the saturation mode.

The RF RMS detection circuit 906 includes a RF path 908, a LO path 910, and the DBM 108 and the low pass filter 110 of FIG. 3 including respective dividers for LO and RF paths. The RF path 908 may include a first divider 911 that receives a first RF signal from a first RF source RF1. The output of the first divider 911 is provided to a first sine-to-square wave converter 912. The LO path 910 may include a second divider 914 that receives a second RF signal from a second RF source RF2. The output of the second divider 914 is provided to a second sine-to-square wave converter 916. The dividers 911, 914 may be similar to the dividers 156, 160 of FIG. 3. The sine-to-square wave converters 912, 916 may be similar to the sine-to-square wave converter 114 of FIG. 3 and may be implemented as limiters.

In the example of FIG. 17, both of the paths 908, 910 are effectively handled as LO paths. Square signal outputs of the paths 908, 910 are provided to the DBM 108. The DBM 108 is not operated in the saturation mode and thus operates as a phase detector. This yields a measurement of a phase difference between the signals RF, LO out of the paths 908, 910 based on cos $\Delta\phi$.

The RF RMS detection system 900 allows for an accurate measurement of both amplitudes and a phase difference between the RF signals of the RF sources RF1, RF2. The outputs $DC_{OUT1}$, $DC_{OUT2}$, $DC_{OUT3}$ may be provided to, for example, the controller 46 of FIG. 1. The controller 46 may perform power calculations based on the $DC_{OUT1}$, $DC_{OUT2}$, $DC_{OUT3}$ and adjust outputs of the sources 16, 30 based on the power values calculated. As an example, power P may be represented by equation 4, where the current I and voltage V may be determined respectively based on the outputs $DC_{OUT1}$, $DC_{OUT2}$ and the cos $\Delta\phi$ may be determined based on the output $DC_{OUT3}$.

$$P = IV \cos \Delta\phi \quad (4)$$

The DC outputs of the RF RMS detectors disclosed herein have a linear relationship with receive RF input signals and/or signals received by sensor circuits of the RF RMS detectors. This allows the RF RMS detectors to be easily calibrated via, for example, the controller 46 of FIG. 1. As an example, two or more RF input voltages may be provided to the RF RMS detectors and corresponding DC outputs of the RF RMS detectors may be detected. Based on this information, a slope m and an offset b of a linear relationship (e.g., y=mx+b, where x is the RF input voltage and y is the DC output voltage) may be adjusted. The slope and offset may be adjusted in the analog domain or digitally at the outputs of the RF RMS detectors via, for example, the controller 46.

The calibration of the RF RMS detector circuits may include: selecting two calibration points that are spaced far apart, such as points at edges of the dynamic range limits (high and low) to maximize dynamic range at the trade-off of linearity and accuracy; selecting two nearby calibration points in a small window for good linearity and accuracy, at the trade-off of dynamic range; performing piece-wise linear calibration by picking a variety of gain and offset calibration values to provide a balanced trade-off between both dynamic range and accuracy; and/or performing other more complex software-based calibration methods for improved accuracy. Minimal calibration and/or no calibration may be needed depending on performance of the circuit components used.

The DBMs disclosed herein provide linear DC output performance over temperature and frequency. The disclosed buffers may include, for example, a 400 MHz amplifier for high-speed alternating current (AC) performance and low-noise. Since the amplifier is AC coupled, DC offset drift is not an issue. The sine-to-square wave converters including RSSI feedback control may have outputs that exhibit low-phase-shift and high-rise/fall time. The current boost circuits/drivers disclosed herein may exhibit high-drive strength and low-input swing. The RF RMS detectors disclosed exhibit a high-dynamic range (e.g., 1500:1), high-linearity with low-error and high-repeatability.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A radio frequency detector comprising:
  a local oscillator path comprising
    a first buffer to receive a first radio frequency signal, wherein the first radio frequency signal is based on a radio frequency input signal received by the radio frequency detector, and wherein the radio frequency input signal is detected by the radio frequency detector within a substrate processing system, and
    a sine-to-square wave converter to convert a sine wave of the first radio frequency signal to a square wave and output a local oscillator signal having the square wave;
  a radio frequency path comprising a second buffer, wherein the second buffer is to receive a second radio frequency signal and output a radio frequency output signal, and wherein the second radio frequency signal is based on the radio frequency input signal;
  a mixer to generate an intermediate frequency signal based on the local oscillator signal and the radio frequency output signal; and
  a filter to filter the intermediate frequency signal to generate a first direct current signal, wherein the first direct current signal is representative of the second radio frequency signal.

2. The radio frequency detector of claim 1, further comprising a divider network to, based on the radio frequency input signal, output the first radio frequency signal and the second radio frequency signal.

3. The radio frequency detector of claim 2, wherein the divider network comprises:
   a first divider to output the first radio frequency signal based on the radio frequency input signal; and
   a second divider to output the second radio frequency signal based on the radio frequency input signal.

4. The radio frequency detector of claim 2, wherein the divider network generates the first radio frequency signal to have a different amplitude than the second radio frequency signal.

5. The radio frequency detector of claim 1, wherein the radio frequency input signal, first radio frequency signal and the second radio frequency signal have varying amplitudes.

6. The radio frequency detector of claim 1, wherein the mixer is a double balanced mixer.

7. The radio frequency detector of claim 6, wherein:
   the double balanced mixer is configured as a phase detector operating in a saturated mode; and
   while in the saturated mode, the local oscillator signal is driven via the local oscillator path with a higher current level than a current level of the radio frequency output signal.

8. The radio frequency detector of claim 6, wherein the double balanced mixer comprises a diode bridge ring.

9. The radio frequency detector of claim 8, wherein:
   the diode bride ring comprises a plurality of legs; and
   each of the plurality of legs comprises two diodes.

10. The radio frequency detector of claim 6, wherein the double balanced mixer comprises a diode array.

11. The radio frequency detector of claim 6, wherein the double balanced mixer comprises a transistor ring.

12. The radio frequency detector of claim 1, wherein:
    the sine-to-square wave converter converts the first radio frequency signal, having a varying amplitude, to the local oscillator signal; and
    the local oscillator signal has a fixed amplitude.

13. The radio frequency detector of claim 1, further comprising:
    an amplifier to amplify or attenuate the first radio frequency signal; and
    a comparator to compare a received signal strength signal with a reference voltage,
    wherein:
      the sine-to-square wave converter is implemented as a limiter,
      the limiter comprises a received signal strength sensor and an output port,
      the received signal strength sensor detects a signal strength of an output of the amplifier,
      the output port outputs the received signal strength signal based on output of the received signal strength sensor, and
      the output of the comparator is fed back to the amplifier.

14. The radio frequency detector of claim 1, wherein:
    the local oscillator path further comprises a current boost circuit; and
    the current boost circuit is to increase a current level of the local oscillator signal.

15. The radio frequency detector of claim 14, wherein the current boost circuit comprises a driver or a plurality of amplifiers.

16. The radio frequency detector of claim 14, wherein the current boost circuit comprises a low voltage differential signaling-to-transistor-to-transistor logic converter.

17. The radio frequency detector of claim 14, wherein the current boost circuit comprises a transformer.

18. The radio frequency detector of claim 1, wherein the filter is a low pass filter or a band pass filter.

19. The radio frequency detector of claim 1, wherein the radio frequency path further comprises a delay circuit to delay the radio frequency output signal.

20. The radio frequency detector of claim 1, wherein the local oscillator path comprises a delay circuit to delay the local oscillator signal.

21. The radio frequency detector of claim 1, wherein:
    the local oscillator path comprises a second filter;
    the second filter is to filter the first radio frequency signal and provide the filtered first radio frequency signal to the sine-to-square wave converter;
    the radio frequency path comprises a third filter; and
    the third filter is to filter the second radio frequency signal and provide the filtered second radio frequency signal to the mixer.

22. The radio frequency detector of claim 1, wherein the radio frequency output signal is in-phase with the local oscillator signal or an integer multiple of 180° out-of-phase with the local oscillator signal.

23. The radio frequency detector of claim 1, further comprising a differential-to-single ended conversion device, wherein:
    the local oscillator signal is a differential signal;
    the differential-to-single ended conversion device converts the differential signal to a second local oscillator signal; and
    the mixer generates the intermediate frequency signal based on the second local oscillator signal.

24. The radio frequency detector of claim 1, wherein:
    the local oscillator path further comprises one or more amplifier/clamping diode sets; and
    the one or more amplifier/clamping diode sets comprise
      an amplifier configured to amplify the first radio frequency signal,
      a first diode connected to an output of the amplifier, and
      a second diode connected to an output of the amplifier and in series with the first diode, wherein the first diode and the second diode are connected between a reference voltage terminal and a ground reference terminal.

25. A radio frequency detection system comprising:
    the radio frequency detector of claim 1, wherein the first direct current signal is indicative of a voltage amplitude of the second radio frequency signal;
    a second radio frequency detector comprising a second mixer, wherein the second mixer is to receive a third radio frequency signal and generate a second intermediate frequency signal, and wherein the second radio frequency detector is to, based on the second intermediate frequency signal, generate a second direct current signal indicative of a voltage amplitude of the third radio frequency signal; and
    a third radio frequency detector comprising a third mixer, wherein the third mixer is to generate a third intermediate frequency signal, and wherein the third radio frequency detector is to generate a third direct current signal indicative of a phase between the second radio frequency signal and the third radio frequency signal.

26. A substrate processing system comprising:
    a substrate support;
    a radio frequency generator;
    an electrode disposed in the substrate support or the radio frequency generator; and the radio frequency detector of claim 1, wherein the radio frequency detector is to detect the radio frequency input signal via the electrode.

27. A method of operating a radio frequency detector, wherein the radio frequency detector comprises a local oscillator path, a radio frequency path, a mixer, and a filter, wherein the local oscillator path comprises a first buffer and sine-to-square wave converter, and wherein the radio frequency path comprises a second buffer, the method comprising:
   detecting a radio frequency input signal within a substrate processing system;
   receiving a first radio frequency signal at the first buffer, wherein the first radio frequency signal is based on the radio frequency input signal;
   converting a sine wave of the first radio frequency signal to a square wave via the sine-to-square wave converter and outputting a local oscillator signal having the square wave;
   receiving a second radio frequency signal at the second buffer and outputting a radio frequency output signal, wherein the second radio frequency signal is based on the radio frequency input signal;
   generating an intermediate frequency signal via the mixer based on the local oscillator signal and the radio frequency output signal; and
   filtering the intermediate frequency signal via the filter to generate a direct current signal, wherein the direct current signal is representative of the second radio frequency signal.

28. A radio frequency detector comprising:
   a buffer to receive a first radio frequency signal, wherein the first radio frequency signal is generated based on a radio frequency input signal received by the radio frequency detector, and wherein the radio frequency input signal is detected by the radio frequency detector within a substrate processing system;
   a first filter to filter an output of the buffer;
   an amplifier to, based on an output of the filter, generate a differential output including a second radio frequency signal and a third radio frequency signal;
   a local oscillator path comprising a sine-to-square wave converter to convert a sine wave of the second radio frequency signal to a square wave and output a local oscillator signal having the square wave;
   a radio frequency path comprising a delay circuit, wherein the delay circuit is to receive the third radio frequency signal and output a radio frequency output signal;
   a double balanced mixer or a linear mixer to generate an intermediate frequency signal based on the local oscillator signal and the radio frequency output signal; and
   a second filter to filter the intermediate frequency signal to generate a direct current signal, wherein the direct current signal is representative of the second radio frequency signal.

29. The radio frequency detector of claim 28, further comprising a divider to receive the radio frequency input signal,
   wherein the buffer is to receive an output of the divider.

* * * * *